(12) United States Patent
Katori (10) Patent No.: US 6,381,119 B1
(45) Date of Patent: Apr. 30, 2002

(54) ELECTRONIC THIN FILM MATERIAL, DIELECTRIC CAPACITOR, AND NONVOLATILE MEMORY

(75) Inventor: Kenji Katori, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/707,215

(22) Filed: Nov. 6, 2000

(30) Foreign Application Priority Data

Nov. 5, 1999 (JP) ............................................ 11-314998

(51) Int. Cl.$^7$ ................................................ H01G 4/06
(52) U.S. Cl. .................... 361/313; 361/311; 361/321.1; 361/306.3; 361/305; 257/306; 257/308; 257/295; 501/134; 501/135; 501/139
(58) Field of Search ................................ 361/313, 311, 361/305, 306.3, 321.1, 321.5, 309, 320; 257/306, 308, 309, 295; 501/134, 135, 139

(56) References Cited

U.S. PATENT DOCUMENTS

| | | | | | |
|---|---|---|---|---|---|
| 4,749,669 A | * | 6/1988 | Nishigaki et al. | ........... | 501/139 |
| 4,900,702 A | * | 2/1990 | Tsuboi et al. | ............... | 501/134 |
| 5,304,521 A | * | 4/1994 | Abe et al. | ................... | 501/139 |
| 5,449,652 A | * | 9/1995 | Swartz et al. | ............... | 501/134 |
| 5,471,363 A | * | 11/1995 | Mihara | ....................... | 361/305 |
| 5,973,911 A | * | 10/1999 | Nishioka | ..................... | 361/313 |
| 6,096,672 A | * | 8/2000 | Kim et al. | .................. | 501/135 |
| 6,137,672 A | * | 10/2000 | Mizuno et al. | .......... | 361/321.4 |
| 6,307,731 B1 | * | 10/2001 | Katori | ....................... | 361/305 |

* cited by examiner

Primary Examiner—Dean A. Reichard
Assistant Examiner—Nguyen Ha
(74) Attorney, Agent, or Firm—Sonnenchein, Nath & Rosenthal (57) ABSTRACT

The invention provides an electronic thin-film material suitable for composing a diffusion preventive layer for use in a ferroelectric capacitor, a ferroelectric capacitor using such diffusion preventive layer composed of the electronic thin-film material, and a non-volatile memory using such ferroelectric capacitor. The ferroelectric capacitor 10 is composed of a diffusion preventive layer made of a CrTa film 2, a lower electrode made of a Pt film 3, a ferroelectric film 4 made of PZT, and an upper electrode made of a Pt film 5, which are sequentially laminated on a surface of a silicon substrate. The CrTa film 2 itself is an alloy film comprising 90-atomic % of Cr and 10-atomic % of Ta, which can be formed via a sputtering process. Inasmuch as the ferroelectric capacitor 10 is composed of the CrTa film 2, it is possible to utilize PZT requiring high-temperature thermal treatment to form the ferroelectric film material.

9 Claims, 7 Drawing Sheets

ELECTRONIC THIN FILM MATERIAL, DIELECTRIC CAPACITOR, AND NONVOLATILE MEMORY

RELATED APPLICATION DATA

The present application claims priority to Japanese Application No. P11-314998 filed Nov. 5, 1999, which application is incorporated herein by reference to the extent permitted by law.

BACKGROUND OF THE INVENTION

1. Field of the Invention

The present invention relates to an electronic thin-film material, a dielectric capacitor using such electronic thin-film material, and a nonvolatile memory using such dielectric capacitor.

2. Description of the Related Art

Figure 6:
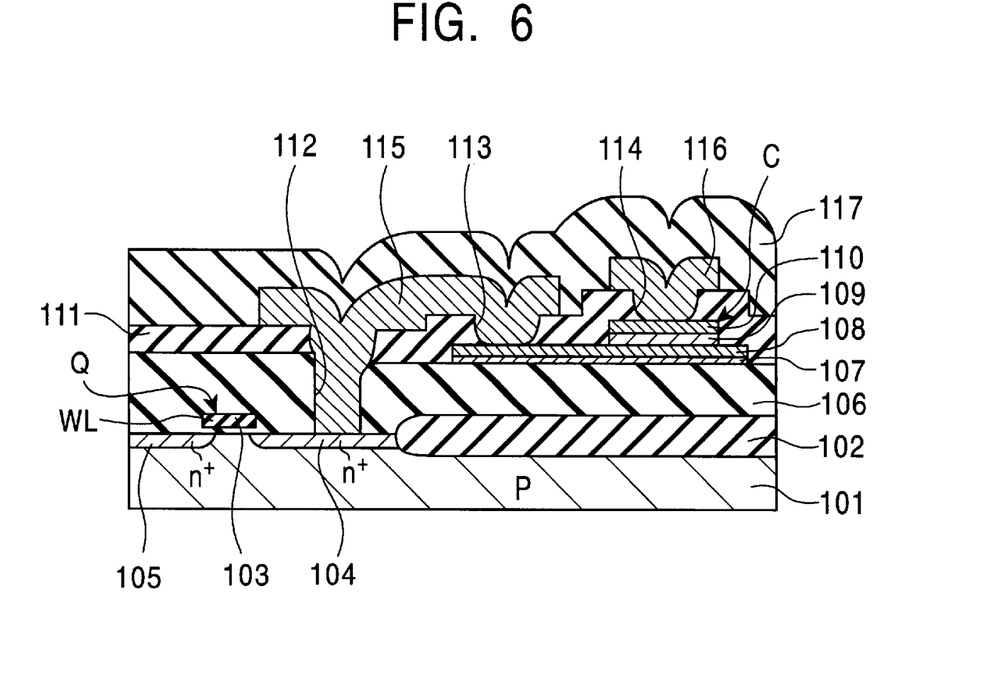
FIG. 6 is a cross-sectional view designating composition of a conventional ferroelectric memory disposing a transistor and a capacitor in the horizontal direction.

Substantially, a ferroelectric memory is a nonvolatile memory which is capable of executing high-speed rewriting operation by way of utilizing high-speed reversal of polarization of a ferroelectric film and its excellent remnant polarization. FIG. 6 exemplifies one example of a conventional ferroelectric memory comprising a transistor and a capacitor respectively being disposed in the lateral direction.

As is apparent from FIG. 6, in the exemplified conventional ferroelectric memory, a field insulating film 102 is selectively disposed on a surface of a p-type silicon substrate 101 for effecting device isolation. A gate insulating film 103 is formed on a surface of an active area in a portion surrounded by the field insulating film 102. A reference code WL designates a word line. An $n^+$-type source area 104 and an $n^+$-type drain area 105 are formed inside of the p-type silicon substrate 101 on both-side portions of the word line WL. The word line WL, the source area 104, and the drain area 105 jointly constitute a transistor Q.

A reference numeral 106 designates an inter-layer insulating film. A Pt (platinum) film 108 having approximately 200 nm of thickness functioning itself as a lower electrode, a ferroelectric film 109 made of Pb (Zr,Ti) $O_3$ (PZT) or $SrBi_2Ta_2O_9$ (SBT) having approximately 200 nm of thickness for example, and another Pt film 110 having approximately 200 nm of thickness functioning itself as an upper electrode for example, are sequentially laminated on the inter-layer insulating film 106 at an upper portion of the field insulating film 102 via a Ti (titanium) film 107 having about 30 nm of thickness functioning itself as a bonding layer. The above Pt film 108, the ferroelectric film 109, and the Pt film 110 jointly constitute a capacitor C. The above-referred transistor Q and the capacitor C constitute a memory cell.

A reference numeral 111 also designates an inter-layer insulating film. A contact hole 112 is formed through the inter-layer insulating film 106 and the other inter-layer insulating film 111 at an upper portion of the source area 104. Another contact hole 113 is formed through the inter-layer insulating film 111 at an upper portion of the Pt film 110. The source area 104 of the transistor Q is connected to the Pt film 108 being a lower electrode of the capacitor C via the contact holes 112 and 113 by means of wiring 115. Wiring 116 is connected to the Pt film 110 being an upper electrode of the capacitor C via a contact hole 114. A reference numeral 117 designates a passivation film.

In the conventional ferroelectric memory shown in FIG. 6, the transistor Q and the capacitor C are disposed in the horizontal direction in parallel with the surface of the silicon substrate 101. However, in order to improve data-recording density, it is necessary to dispose the transistor Q and the capacitor C in the direction vertical to the surface of the substrate 101 (this is referred to as a stack-type construction). One embodiment for the stack-type construction is exemplified in FIG. 7. Those components shown in FIG. 7 via the reference numerals identical to those shown in FIG. 6 are respectively designated by way of the identical reference numerals.

Figure 7:
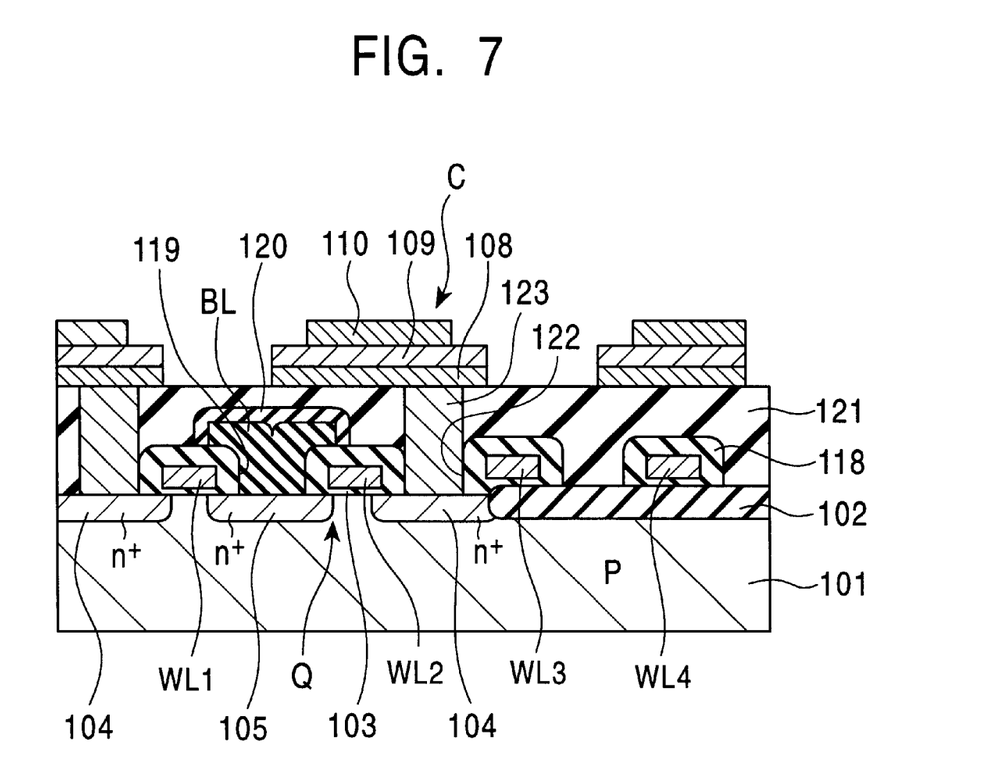
FIG. 7 is a cross-sectional view designating composition of a conventional ferroelectric memory disposing a transistor and a capacitor in the vertical direction.

In FIG. 7, the reference codes WL1 through WL4 respectively designate word lines, whereas a reference numeral 118 designates an inter-layer insulating film. A contact hole 119 is formed through the interlayer insulating film 118 at an upper portion of a drain area 105. A bit line BL is connected to the drain area 105 of a transistor Q via the contact hole 119. A reference numerals 120 and 121 respectively designate inter-layer insulating films. A contact hole 122 is formed through the inter-layer insulating film 121 at an upper portion of a source area 104. A polycrystal silicon plug 123 is buried in the contact hole 122. The source area 104 of the transistor Q and a Pt film 108 of a lower electrode of a capacitor C are electrically connected to each other via the polycrystal silicon plug 123.

Normally, whenever forming a ferroelectric film 109, in order to realize crystallization of the film components, it is essential that a thermal treatment process is executed in oxidization atmosphere containing 550° through 800° C. of very high temperature. Nevertheless, during the thermal treatment process, silicon component of the polycrystal silicon plug 123 is thermally diffused into the Pt-film 108 of the lower electrode of the capacitor C to cause the diffused silicon component to be oxidized at the upper layer of the Pt-film 108, whereby causing the Pt-film 108 to lose own electrical conductivity, and yet, because of further diffusion of the silicon component into the ferroelectric film 109, the capacitor C incurs significant degradation of own physical characteristics, thus raising a problem.

There is such a technical report suggesting that, when the ferroelectric film 109 is made from PZT (lead-zirconatetitanate) compound material, the PZT is processed via an annealing process at 550° through 600° C. of temperature, whereby enabling to utilize an nitride film such as TiN for composing a barrier layer to prevent silicon component from diffusing into the ferroelectric film 109. This report was publicized via the lecture of the Applied Physics Academy of Japan held in autumn, 1996, via 7p-F-10, under the title of "Evaluation of oxidation-proof characteristics of a barrier layer comprising a TiN film used for ferroelectric capacitor".

Nevertheless, the nitride film is oxidized via the thermal treatment process executed at a very high temperature in the oxidization atmosphere, thus losing own electrical conductivity. Thus, in order to further improve ferroelectric characteristics of the ferroelectric film 109, when sufficient volume of oxygen is fed into the thermal treatment atmosphere to execute the thermal treatment process at a still higher temperature, the oxidization effect causes the film surface to be roughened and electrical resistance to be intensified. Normally, a ferroelectric film generates substantial film stress. However, the nitride film proves to be insufficient in the film adhesion property to cause the film itself to be stripped off, thus raising a problem.

As in the case of such a conventional ferroelectric memory shown in FIG. 7, when disposing the transistor Q and the capacitor C in the vertical direction and connecting the Pt film 108 of the lower electrode of the capacitor C to the source area 104 of the transistor Q via the polycrytal silicon plug 123 or a tungsten (W) plug, it is quite difficult to utilize the PZT requiring a high temperature thermal treatment for the material to make up the ferroelectric film 109 of the capacitor C.

SUMMARY OF THE INVENTION

Accordingly, a primary object of the present invention is to provide a novel stack-type capacitor capable of realizing high integration with a simple composition. More particularly, the invention provides a novel electronic ferroelectric film material suitable for composing a barrier layer for preventing silicon component or tungsten component of a plug from diffusing into a lower electrode of a ferroelectric film in the course of connecting the lower electrode of the ferroelectric film to diffusive layer of a transistor via the plug made from polycrystal silicon or tungsten after disposing the transistor and a novel ferroelectric capacitor in the vertical direction, where the novel electronic ferroelectric film material is also suitable for composing the lower electrode depending on practical cases. The invention further provides a novel ferroelectric capacitor which is capable of effectively utilizing PZT as material for composing a ferroelectric film as a result of the provision of the above-referred barrier layer. The invention further provides a novel nonvolatile memory which effectively utilizes the above mentioned ferroelectric capacitor.

It should be understood that the inventor of the present invention had previously reported in the Japanese Laid-Open Patent No. H10-242409/1998 that a stack-type structure could be realized even when utilizing a ferroelectric thin film. After further following up researches, it was eventually confirmed that the stack-type structure could assuredly be materialized via further simplified composition.

Specifically, in order to achieve the above objects, the novel electronic thin film material according to the first invention is expressed by way of a formula shown below.

$$CraMb$$

In this case, "a" and "b" respectively designate composition expressed in terms of atomic %; and M designates at least one kind of transition metal selected from the group consisting of Ta (tantalum), Nb (niobium), Zr (zirconium), Hf (hafnium), W (tungsten), and Mo (molybdenum), where the composition range of M is expressed in terms of $95 \geq a \geq 60$, $40 \geq b \geq 5$, and $a+b=100$. The code Cr shown in the above formula designates chromium.

A novel dielectric capacitor according to the second invention comprises a novel diffusion preventive layer (i.e., buffer layer) composed of the novel electronic thin-film material which is expressed by way of a formula shown below.

$$CraMb$$

In this case, "a" and "b" respectively designate composition expressed in terms of atomic %; and M designates at least one kind of transition metal selected from the group consisting of Ta, Nb, Zr, Hf, W, and Mo, where the composition range of M is expressed in terms of $95 \geq a \geq 60$, $40 \geq b \geq 5$, and $a+b=100$.

The dielectric capacitor according to the second invention further comprises a lower electrode formed on the above-referred diffusion preventive layer, a ferroelectric film (or a thin-film made from dielectric substance containing high dielectric constant) formed on the lower electrode, and an upper electrode formed on the ferroelectric film.

It is desired for the lower electrode of the dielectric capacitor according to the second invention that the lower electrode itself is made from such a dielectric substance containing low electrical resistance value and thermally resistant property. It is further desired that the lower electrode of the dielectric capacitor is formed with platinum, iridium, ruthenium, palladium, or rhodium.

A nonvolatile memory according to the third invention comprises a memory cell comprising a transistor and the above-referred dielectric capacitor, wherein the dielectric capacitor comprises the novel electronic thin film material which is expressed by way of a formula shown below.

$$CraMb$$

In this case, "a" and "b" respectively designate composition expressed in terms of atomic %; and M designates at least one kind of transition metal selected from the group consisting of Ta, Nb, Zr, Hf, W, and Mo, where the composition range of M is expressed in terms of $95 \geq a \geq 60$, $40 \geq b \geq 5$, and $a+b=100$.

The novel non-volatile memory further comprises a lower electrode formed on the above-referred diffusion preventive layer, the ferroelectric film formed on the lower electrode, and an upper electrode formed on the ferroelectric film.

It is desired for the lower electrode of the dielectric capacitor for composing part of the nonvolatile memory according to the third invention that the lower electrode itself is made from such dielectric substance containing low electrical resistance value and thermally resistant property. It is further desired that the lower electrode is disposed on a polycrystal silicon plug or a tungsten plug formed on the transistor.

DESCRIPTION OF THE PREFERRED EMBODIMENTS

Referring to the accompanying drawings, practical forms for implementing the invention are described below.

Figure 1:
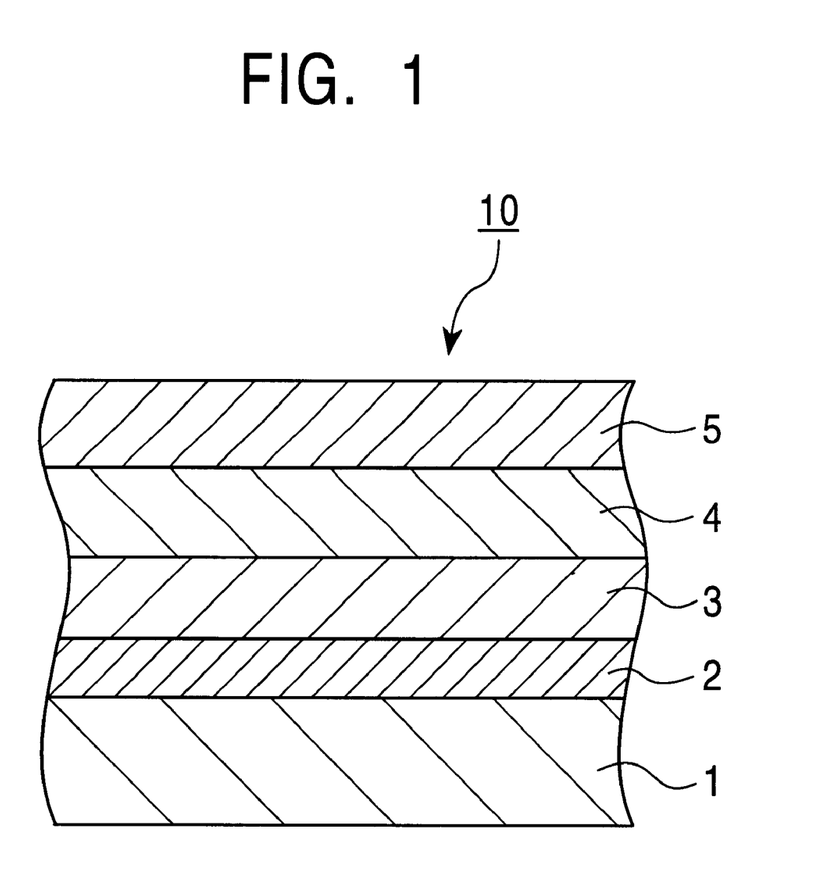
FIG. 1 is a simplified cross-sectional view of a ferroelectric capacitor according to one of practical forms for implementing the invention.

As is clear from a cross-sectional view shown in FIG. 1, a ferroelectric capacitor 10 according to the invention consists of five-layer composition made of a chromium-tantalum (Cr/Ta) thin film 2 as a diffusion preventive (buffer) layer formed on a silicon (Si) substrate 1, a lower electrode made of a platinum (Pt) thin film 3, a ferroelectric film 4 made of PZT, and an upper electrode made of a platinum (Pt) thin film 5, which are sequentially laminated based on the above sequence. Thickness of the above component films is exemplified to be 50 nm provided for the Cr/Ta thin film 2, 200 nm for the Pt thin film 3, 250 nm for the PZT thin film 4, and 200 nm provided for the other Pt thin film 5. The above ferroelectric film is formed based on a formula "CraMb", where the component M corresponds to Ta in the Cr/Ta thin film 2 and the atomic percentage of Ta is defined to be 10%.

It is preferred that the upper electrode or the lower electrode is made from platinum (Pt), iridium (Ir), ruthenium (Ru), palladium (Pd), or rhodium (Rh).

As is apparent from the above description, the dielectric capacitor and a nonvolatile memory proposed by the invention characteristically utilizes such diffusion preventive layer composed of thin-film material that can be expressed in terms of the above-referred formula "CraMb". The thin-film material has eventually been developed as a result of implementing a wide variety of experiments. By virtue of utilizing the thin-film material, it is possible to secure distinctive ferroelectric electrical characteristics while preventing silicon elements from diffusing themselves out from a silicon plug. In other words, it is so demanded that the diffusion preventive layer must function itself to secure conductivity while preventing silicon elements from diffusing themselves, and yet, prevent silicon elements from being oxidized. When chromium metal is solely used, silicon elements can not be prevented from diffusing themselves to cause chromium component to easily turn into silicide.

Inventor of the present invention eventually confirmed that the above-cited defect could properly be corrected by way of introducing at least one kind among metallic elements including tantalum (Ta), niobium (Nb), zirconium (Zr), hafnium (Hf), tungsten (W), and molybdenum (Mo) for combination with chromium (Cr). More particularly, by way of adding a high melting point element to chromium, recrystallization temperature capable of generating self diffusion can be raised.

In order to check stability of the thin film based on the formula "CraMb", test samples were prepared by way of discretely forming a chromium thin film, a tantalum thin film, and a chromium-tantalum combined thin film, on a plurality of silicon substrates via a sputtering process. These samples were discretely annealed in oxidizing atmosphere shown below. Actual aspects of the test samples before and after execution of the annealing process were analyzed via the X-ray diffraction analysis. The annealing process was executed under specific thermal treatment condition capable of generating satisfactory PZT-based ferroelectric characteristics in the atmosphere containing 580° C. of temperature, argon gas, and 10% concentration of $O_2$ gas, for an hour.

Figure 2A:
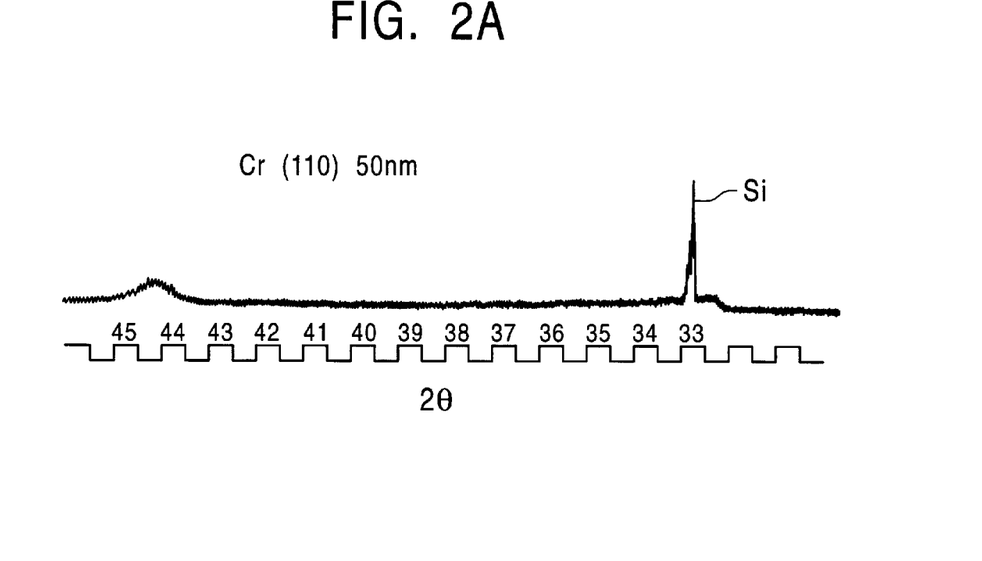
FIGS. 2A and 2B are respectively graphic charts designating the result of the X-ray diffraction analysis before and after annealing a chromium (Cr) thin film formed on a silicon substrate.
Figure 2B:
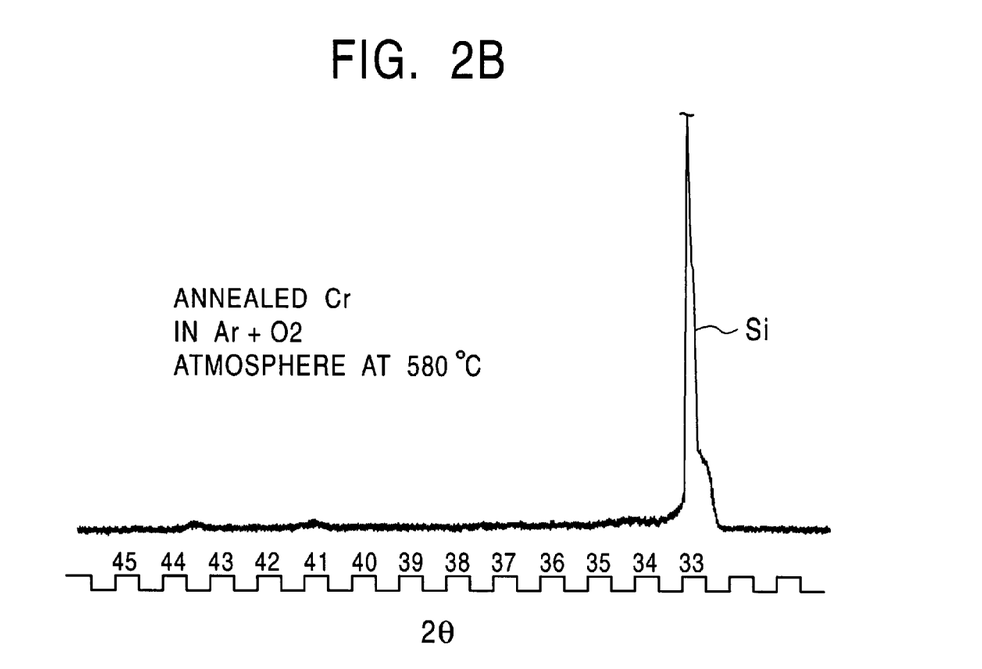

FIGS. 2A and 2B graphically designate actual aspects of the variation of the peak values generated via the X-ray diffraction analysis before and after annealing the chromium thin film, in which a horizontal axis designates 2 θ (diffraction angle), whereas a vertical axis designates intensity of diffraction ray. FIG. 2A designates the aspect immediately after formation of the chromium thin film. FIG. 2B designates the aspect after completing the annealing process of the chromium thin film in the oxidizing atmosphere.

Inasmuch as chromium itself is relatively resistant against oxidation, chromium is not subject to oxidation under the above-specified thermal treatment condition. However, once a chromium thin film has been formed on the silicon substrate, chromium is apt to react against silicon. Thus, as is clear from the result shown in FIG. 2B, peak of the diffraction value of chromium disappears after completing the annealing process in the oxidizing atmosphere. Even after annealing chromium in vacuum, identical result was generated. Graphical designation of this result is deleted.

Figure 3A:
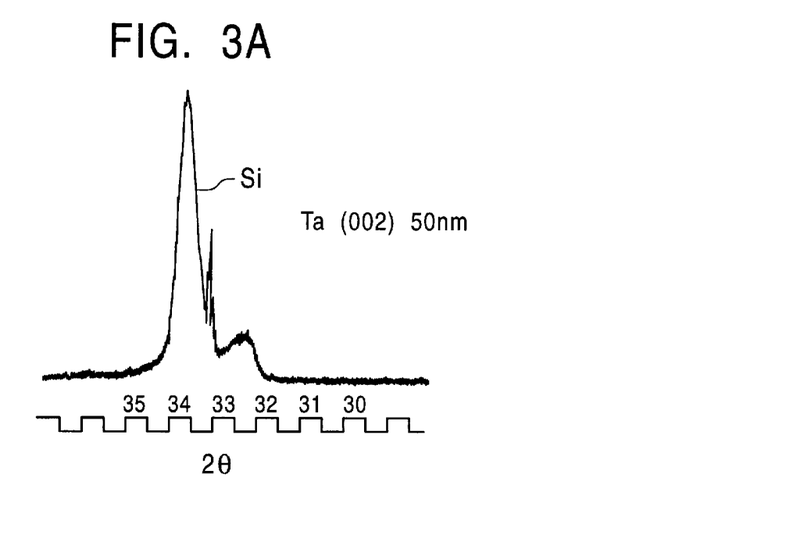
FIGS. 3A through 3C are respectively graphic charts designating the result of the X-ray diffraction analysis before and after annealing a tantalum (Ta) thin film formed on a silicon substrate.
Figure 3B:
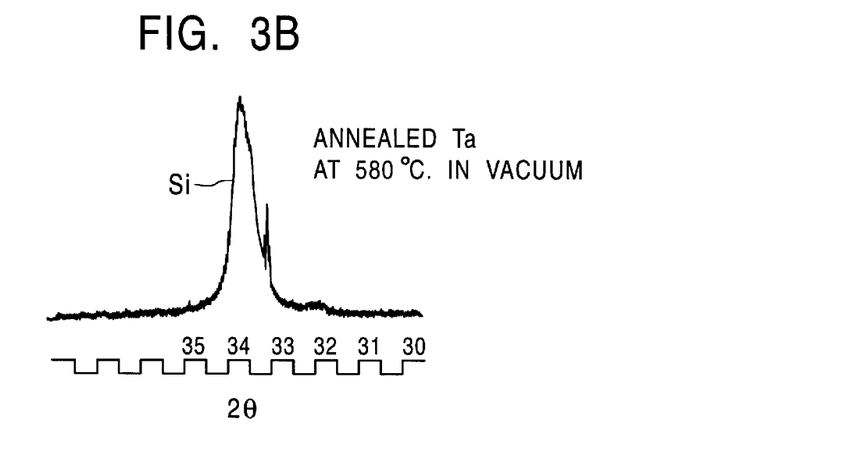
Figure 3C:
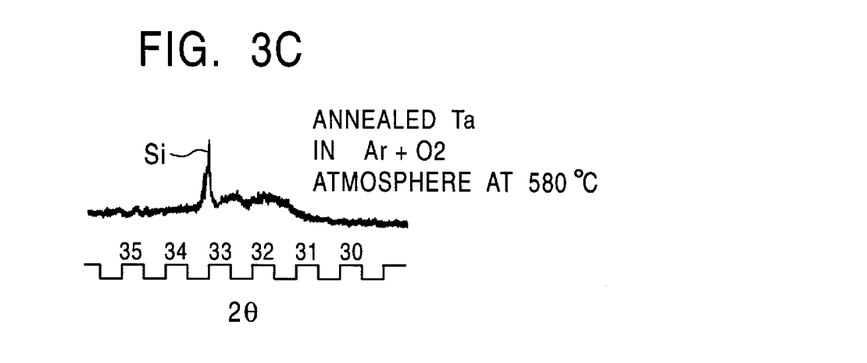

FIGS. 3A to 3C graphically designate actual aspects of the variation of the peak values generated via the X-ray diffraction analysis before and after annealing the tantalum thin film. FIG. 3A designates the varied peak immediately after formation of the tantalum thin film. FIG. 3B designates the varied peak after completing the annealing process in vacuum. FIG. 3C designates the varied peak after completing the annealing process in the oxidizing atmosphere.

Tantalum itself contains as high as 2996° C. of melting point, and thus, tantalum remains stable unless being present in oxidizing atmosphere. As is apparent from the figure, even when being annealed in vacuum, tantalum does not react against silicon, but it preserves own crystalline composition substantially being identical to the composition immediately after being formed into a thin film. Nevertheless, tantalum is not fully resistant to oxidation at high temperature, and thus, as shown in FIG. 3C, the peak of the diffraction of tantalum thin film disappears after being annealed in the oxidizing atmosphere.

Figure 4A:
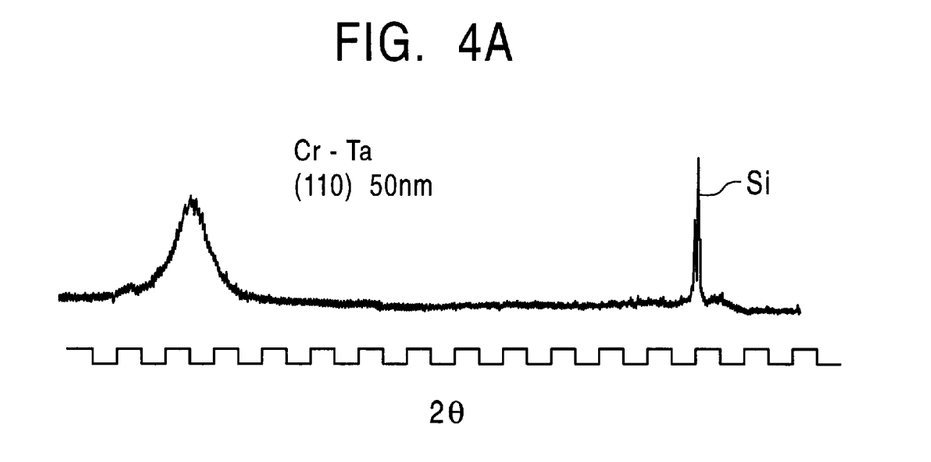
FIGS. 4A and 4B are respectively graphic chart designating the result of the X-ray diffraction analysis before and after annealing a Cr/Ta thin film formed on a silicon substrate.
Figure 4B:
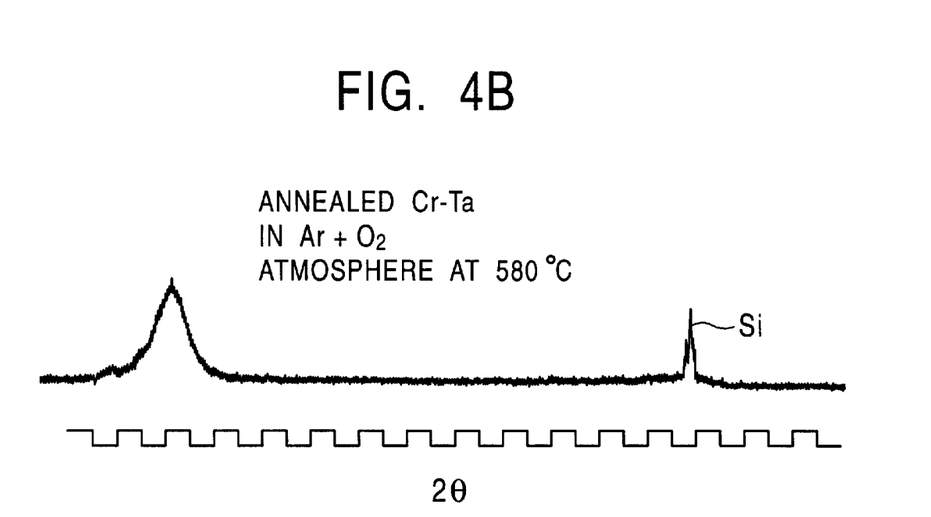

Unlike the above-referred chrome thin film and tantalum thin film, as is evident from comparison between FIG. 4A and FIG. 4B, even after being annealed in the oxidizing atmosphere, the chromium-tantalum alloy thin film comprising 90-atomic% of chromium and 10-atomic % of tantalum does not react against silicon, and yet, the alloy thin film remains without being oxidized at all, and yet, remains extremely stable.

According to the result of experiments executed by the inventor, even when replacing tantalum with any of those counterparts such as niobium (Nb), zirconium (Zr), hafnium (Hf), tungsten (W), or molybdenum (Mo), for example, even in the case of forming such a thin film comprising binary alloy of chromium and zirconium, outstanding effect identical to the above-referred binary alloy was secured. Further, even when forming such a thin film comprising ternary alloy using chromium-tantalum-zirconium, it was confirmed that outstanding effect identical to the above-referred binary alloy was also secured.

In order to satisfy the above-referred formula "CraMb" for substantiating the invention, it is preferred that the amount of metal M containing high melting point (such as tantalum for example) to be added to chromium, in other words, the value (atomic %) of "b" of the Mb component of the above formula is in a range from 5 to 40, whereas the value of "a" of the above-referred Cra component ranges from 60 to 95. It was evidenced that, if the added amount of high melting point metal M were less than 5-atomic %, reaction between chromium and silicon was apt to occur, and yet, it was also confirmed that, if the added amount of high melting point metal M were in excess of 40-atomic %, the alloy thin film was easily subject to oxidation.

In this way, as a result of overall experiments followed up by the inventor, it was evidenced that the alloy based on the formula "CraMb" was effectively utilized for preparing backing-layer material of the lower electrode provided for the ferroelectric capacitor. Inasmuch as the thin film comprising alloy based on the formula "CraMb" does not react against silicon at all, the "CraMb" alloy thin film can be disposed on a silicon plug formed on the transistor.

The First Embodiment:

Initially, a ferroelectric capacitor comprising the laminated structure shown in FIG. 1 was fabricated. Next, superficial $SiO_2$ film was fully removed by way of treating the silicon substrate with diluted acid fluoride. Next, a diffusion preventive layer made of a chromium-tantalum alloy film was formed on the silicon substrate via a sputtering process based on the process condition specified below.

Equipment: Two-pole DC magnetron sputtering device
Target: Chromium metal with 100 mm of diameter
  Four of tantalum metal chips each having 10 mm×10 mm of size
Applied sputtering gas: Argon gas: 30 sccm
Total pressure: 0.2 Pa
Applied power: 0.4A×550V
Film-forming duration: 3 minutes
Film thickness: 50 nm After completing formation of the Cr—Ta alloy thin film, composition of the completed thin film was analyzed via the EPMA (Electronic Probe Micro Analysis) method. The analysis proved that the thin film was composed of 90-atomic % of chromium metal and 10-atomic % of tantalum.

Next, a 200 nm thick platinum thin film usable for the lower electrode was formed on the above-referred Cr—Ta alloy thin film via a sputtering process. Further, a 250 nm thick PZT thin film was formed on the platinum thin film. Next, in order to crystallize the PZT thin film, the silicon substrate complete with formation of the laminated chromium-tantalum-alloy diffusion preventive layer, the platinum thin film, and the PZT thin film, was thermally treated in atmosphere containing argon gas and 10% concentration of oxygen at 580° C. for an hour. In addition, a 200 nm thick platinum thin film usable for the upper electrode was formed on the PZT thin film by applying a metal mask. Further, the silicon substrate was again thermally treated in atmosphere containing oxygen at 450° C. for an hour before eventually yielding a ferroelectric capacitor.

Figure 5:
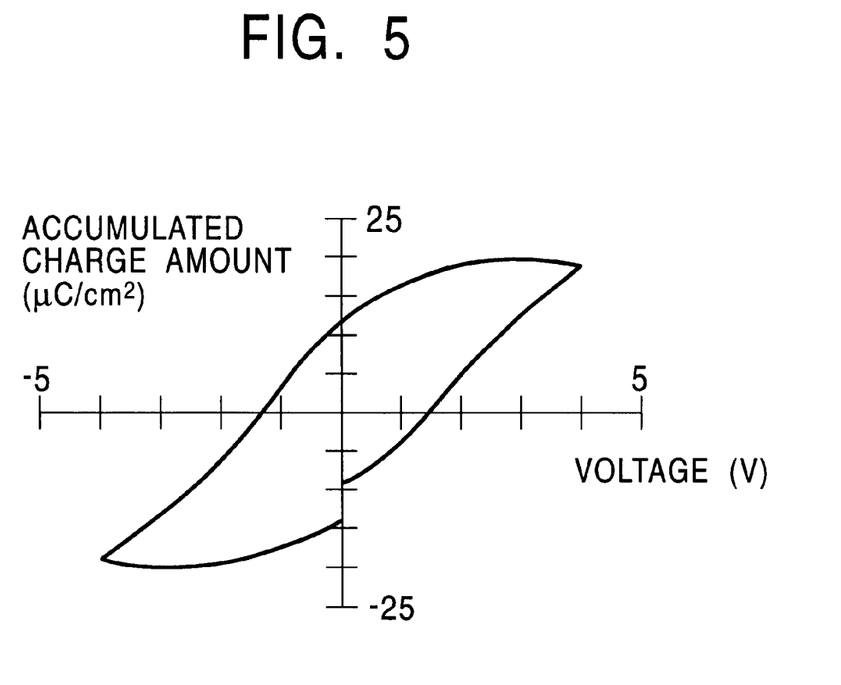
FIG. 5 is a graphic chart designating the result of measuring charge accumulated in a ferroelectric capacitor according to the invention.

Next, by feeding a voltage between the silicon substrate and the platinum-film-made upper electrode of the completed ferroelectric capacitor, actual amount of accumulated charge (i.e., ferroelectric hysteresis) was measured. FIG. 5 designates the result of measuring the actual amount of accumulated charge. This proves that satisfactory remnant polarization value being important for the ferroelectric memory was secured by means of electrical measurement via silicon, and thus, measurement of the PZ ferroelectric characteristics was practicable. Further, it was also confirmed that, effect of adhesion between the chromium-tantalum alloy diffusion preventive layer and the silicon substrate, and the effect of adhesion between the chromium-tantalum alloy diffusion preventive layer and the platinum-film-made lower electrode, were respectively quite satisfactory without generating exfoliation at all. Even when forming the upper or lower electrode with iridium (Ir), ruthenium (Ru), rhodium (Rh), or palladium (Pd), like the above case, it was practicable to measure ferroelectric hysteresis curve between the silicon substrate and the upper electrode.

It should be known however that, when directly forming a ferroelectric film or a dielectric film composed of PZT on an electrode comprising chromium-tantalum alloy, it is not possible to secure satisfactory ferroelectric characteristics or dielectric characteristics. Conceivably, this may be caused by difference of work function or because of any reason related to crystallization of PZT. However, further detail is not clearly known for now.

The First Comparative Example

Replacing the above-referred chromium-tantalum alloy, a 50 nm thick chromium thin film was prepared. Except for provision of the 50 nm thick chromium thin film, by applying the process condition exactly identical to that was applied to the first embodiment, a ferroelectric capacitor was fabricated for comparative test. However, the comparative ferroelectric capacitor totally failed to generate ferroelectric hysteresis curve via electrical measurement through the silicon substrate.

The Second Comparative Example

Replacing the above-referred chromium-tantalum alloy, a 50 nm thick tantalum thin film was prepared. Except for provision of the 50 nm thick tantalum thin film, by applying the process condition exactly identical to that was applied to the first embodiment, a ferroelectric capacitor was fabricated for a comparative test. However, the comparative ferroelectric capacitor totally failed to generate a ferroelectric hysteresis curve via electrical measurement through the silicon substrate.

The Second Embodiment

FIG. 7 designates a ferroelectric memory according to the invention. The ferroelectric memory of a nonvolatile memory shown in FIG. 7 was fabricated according to conventional practice except for the thin-film material used for composing the dielectric capacitor C based on the first embodiment.

The nonvolatile memory showed satisfactory initial characteristics, which was held on for a long duration, whereby resulting in the enhanced reliability.

As is apparent from the above description, the invention provides distinctive effects as cited below.

(1) Effect of the First Invention Related to Electronic Thin-film Material:

By virtue of formulating an electronic film material being resistant to heat and oxidation in conformity with a predetermined formula "CraMb" and a predetermined composition range, the invention provides electronic film material being effective for composing a diffusion preventive layer of a ferroelectric capacitor. More particularly, even when thermally being treated via an annealing process at 580° C. of high temperature needed for crystallizing PZT, the diffusion preventive layer composed of the electronic film material does not react against silicon, and thus, even when utilizing ferroelectric material or dielectric material, it is possible to compose a stack-type capacitor.

(2) Effect of the Second Invention Related to Dielectric Capacitor:

By virtue of composing a dielectric capacitor comprising a diffusion-preventive layer made from electronic film material according to the first invention, a lower electrode formed on the diffusion-preventive layer, a ferroelectric thin film formed on the lower electrode, and an upper electrode formed on the ferroelectric thin film, which are sequentially laminated on a silicon substrate in the above mentioned sequence, it is possible to easily compose a high-performance stack-type capacitor. Accordingly, the invention provides much advantage in that not only PZT, but SBT may also be utilized, which requires thermal treatment at high temperature in atmosphere containing oxygen needed for crystallization thereof.

(3) Effect of the Third Invention Related to a Nonvolatile Memory:

A nonvolatile memory incorporates a memory cell comprising a transistor and a dielectric capacitor. By virtue of combining the above-referred dielectric capacitor comprising the structure according to the second invention with a transistor, it is possible to provide such nonvolatile memory comprising a high-performance stack-type capacitor.

What is claimed is:

1. Electronic thin-film material comprising a composition which is expressed in terms of a formula "CraMb";

wherein "a" and "b" respectively designate a composition expressed by atomic percentage; M designates at least one kind of transition metal selected from a group consisting of Ta, Nb, Zr, Hf, W, and Mo: and composition range of said M metal component is defined to be $95 \geq a \geq 60$, $40 \geq b \geq 5$, and a+b=100.

2. A dielectric capacitor comprising a diffusion preventive layer being composed of electronic material which is expressed in terms of a formula "CraMb"; wherein "a" and "b" respectively designate a composition expressed by atomic percentage; M designates at least one kind of transition metal selected from a group consisting of Ta, Nb, Zr, Hf, W, and Mo; and composition range of said M metal component is defined to be $95 \geq a \geq 60$, $40 \geq b \geq 5$, and a+b=100;

said dielectric capacitor further comprising a lower electrode which is formed on said diffusion preventive layer, a ferroelectric thin film or a dielectric thin film which is formed on said lower electrode; and an upper electrode formed on said ferroelectric thin film or said dielectric thin film.

3. The dielectric capacitor according to claim 1, wherein said upper electrode or said lower electrode is made of platinum.

4. The dielectric capacitor according to claim 2, wherein said upper electrode or said lower electrode is made of iridium.

5. The dielectric capacitor according to claim 2, wherein said upper electrode or said lower electrode is made of ruthenium.

6. The dielectric capacitor according to claim 2, wherein said upper electrode or said lower electrode is made of palladium.

7. The dielectric capacitor according to claim 2, wherein said upper electrode or said lower electrode is made of rhodium.

8. A nonvolatile memory comprising a memory cell consisting of a transistor and a dielectric capacitor; wherein said dielectric capacitor comprises a diffusion preventive layer made from electronic material which is expressed in terms of formula "CraMb"; wherein "a" and "b" respectively designate a composition expressed by atomic percentage; M designates at least one kind of transition metal selected from a group consisting of Ta, Nb, Zr, Hf, W, and Mo; and composition range of said M metal component is defined to be $95 \geq a \geq 60$, $40 \geq b \geq 5$, and a+b=100;

said nonvolatile memory further comprising;

a lower electrode which is formed on said diffusion preventive layer;

a ferroelectric film formed on said lower electrode; and an upper electrode formed on said ferroelectric film.

9. The nonvolatile memory according to claim 8, wherein said lower electrode is disposed on a polycrystal silicon plug or on a tungsten plug formed on said transistor.

* * * * *